US008159029B2

(12) United States Patent
Su et al.

(10) Patent No.: US 8,159,029 B2
(45) Date of Patent: Apr. 17, 2012

(54) HIGH VOLTAGE DEVICE HAVING REDUCED ON-STATE RESISTANCE

(75) Inventors: Ru-Yi Su, Kouhu Township, Yunlin County (TW); Puo-Yu Chiang, Su-ao Township, Yilan County (TW); Jeng Gong, Hsinchu (TW); Tsung-Yi Huang, Hsinchu (TW); Chun-Lin Tsai, Hsinchu (TW); Chien-Chih Chou, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 164 days.

(21) Appl. No.: 12/256,009

(22) Filed: Oct. 22, 2008

(65) Prior Publication Data

US 2010/0096697 A1 Apr. 22, 2010

(51) Int. Cl.
*H01L 29/76* (2006.01)
(52) U.S. Cl. ........... 257/343; 257/E29.018; 257/E29.02; 257/E29.261
(58) Field of Classification Search ........... 257/E29.256, 257/342, 343, E29.268, E29.018, E29.261, 257/E29.02
See application file for complete search history.

(56) References Cited

U.S. PATENT DOCUMENTS

| | | | | |
|---|---|---|---|---|
| 5,496,761 A * | 3/1996 | Ravanelli et al. | ............. | 438/241 |
| 5,798,812 A * | 8/1998 | Nishiki et al. | ................ | 349/152 |
| 5,981,997 A * | 11/1999 | Kitamura | ....................... | 257/335 |
| 6,727,186 B1 * | 4/2004 | Skotnicki et al. | ............. | 438/734 |
| 7,847,351 B2 * | 12/2010 | Denison et al. | ................ | 257/343 |
| 2004/0106236 A1* | 6/2004 | Hu et al. | ......................... | 438/135 |
| 2006/0270171 A1* | 11/2006 | Chen et al. | .................... | 438/297 |
| 2008/0197410 A1 | 8/2008 | Chiang et al. | | |

OTHER PUBLICATIONS

Chinese Patent Office, Office Action dated Mar. 22, 2011, Application No. 200910031496.5, 8 pages.

* cited by examiner

*Primary Examiner* — Wael Fahmy
*Assistant Examiner* — Sarah Salerno
(74) *Attorney, Agent, or Firm* — Haynes and Boone, LLP

(57) ABSTRACT

A semiconductor device includes a semiconductor substrate, a source region and a drain region formed in the substrate, a gate structure formed on the substrate disposed between the source and drain regions, and a first isolation structure formed in the substrate between the gate structure and the drain region, the first isolation structure including projections that are located proximate to an edge of the drain region. Each projection includes a width measured in a first direction along the edge of the drain region and a length measured in a second direction perpendicular to the first direction, and adjacent projections are spaced a distance from each other.

20 Claims, 9 Drawing Sheets

HIGH VOLTAGE DEVICE HAVING REDUCED ON-STATE RESISTANCE

BACKGROUND

The capability of integrating analog, digital, high voltage, and high power functionality in a single technology has been important in the design of various electronic systems. For example, smart power BCD (Bipolar Complementary metal-oxide semiconductor (CMOS) Diffusion metal-oxide semiconductor (DMOS)) technology has been widely used in various high power applications such as automotive electronic systems. This may be due to an ease of integrating a laterally diffused metal oxide semiconductor device (LDMOS) in a Bipolar CMOS (BiCMOS) process flow. A Reduced Surface Field (RESURF) technique has been typically used to optimize device performance and has allowed for the integration of high voltage devices with bipolar and MOS transistors. However, as MOS devices are adapted for high voltage applications, problems arise with respect to high on-state resistance issue. In the LDMOS device, when a high voltage is applied to the gate, an electrical channel under the gate structure has a higher on-state resistance and low saturation current. As a result, the LDMOS power transistor's performance is degraded. One approach to improve on-state resistance is to utilize variation of lateral doping for a drift region in a junction isolation technology. Although this approach has been satisfactory for its intended purpose, it has not been satisfactory in all respects. Therefore, what is needed is a new and improved high voltage device that has a reduced on-state resistance.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
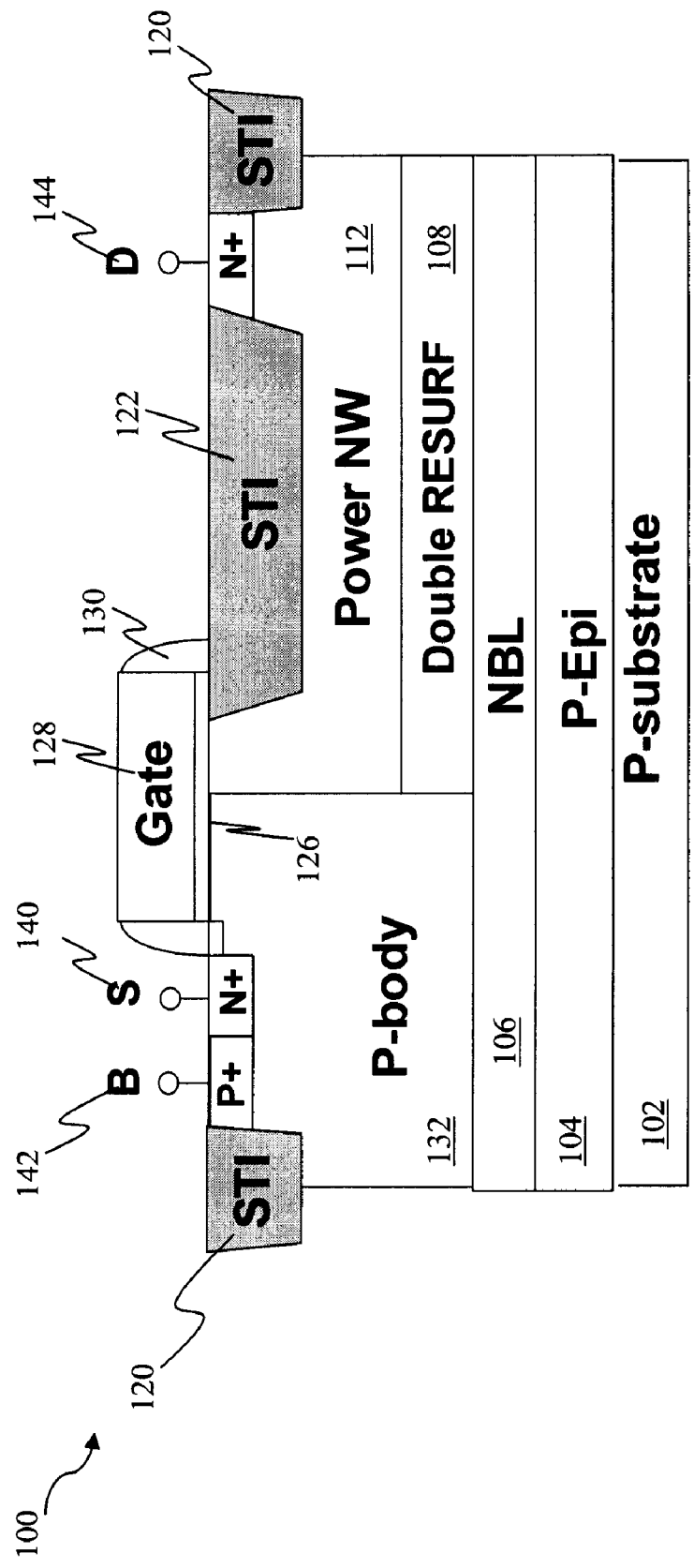
FIG. 1 is a cross-sectional view of a laterally diffused metal oxide semiconductor (LDMOS) device according to various aspects of the present disclosure.

The present disclosure relates generally to the field of semiconductor integrated circuits. It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a cross-sectional view of a LDMOS device 100 according to various aspects of the present disclosure. The LDMOS device 100 may be part of an integrated circuit (IC) that includes various other active and passive microelectronic devices. Accordingly, the LDMOS device 100 may be fabricated in a Bipolar CMOS (BiCMOS) process flow, and it is understood that some process may only be briefly described herein. In the present embodiment, the LDMOS device 100 is configured as an n-channel LDMOS transistor. Further, the LDMOS device 100 may be fabricated with a 0.25 um (250 nm) technology node process, and thus specific dimensions of various structures and features of the LDMOS device 100 disclosed below are examples with respect to the 0.25 um technology process. However, it should be noted that LDMOS device 100 may be fabricated with other technology node processes as well.

The LDMOS device 100 may include a semiconductor substrate 102. The substrate 102 may be or comprise a semiconductor wafer such as a silicon wafer. Alternatively, the substrate 102 may include other elementary semiconductors such as germanium. The substrate 102 may also include a compound semiconductor such as silicon carbide, gallium arsenic, indium arsenide, and indium phosphide. The substrate 102 may include an alloy semiconductor such as silicon germanium, silicon germanium carbide, gallium arsenic phosphide, and gallium indium phosphide. In present embodiment, the substrate 102 includes a P-type silicon wafer (that has a resistivity of about 10 ohm-cm). A P-type epitaxial layer (P-epi layer) 104 with an appropriate doping concentration and thickness may be grown to achieve a high breakdown voltage. An N+ buried layer (NBL) 106 may be formed using high energy antimony implants that may be adopted for forming isolated devices. It is understood that the NBL 106 may be formed at an interface between the P-substrate 102 and P-epi layer 104. A double RESURF (Reduced Surface Field) P-type implant layer 108 may be formed overlying a portion of the NBL 106. The double RESURF layer 108 may be used for vertical RESURF to achieve full depletion of a drift region.

The LDMOS device 100 may include an N-well region 112 (also referred to as a Power NW). The N-well region 112 may function as a drift region for the n-channel LDMOS device. The N-well region 112 may be formed in the P-epi layer 104. Alternatively, the N-well region 112 may be part of the substrate 102 and formed by implantation in absence of an epi layer. The N-well region 112 has an N-type dopant such as phosphorus. In one embodiment, N-well region 112 may be formed by a plurality of processing steps, whether now known or to be developed, such as growing a sacrificial oxide over substrate, opening a pattern for the location of the N-well region, and implanting the impurities.

The LDMOS device 100 may include various isolation structures such as shallow trench isolation (STI) or local oxidation of silicon (LOCOS) formed on the P-epi layer 104/substrate 102 to define and electrically isolate various active regions. In the present embodiment, the device 100 may include a STI structure 120 for isolating the LDMOS device 100 from other neighboring devices (not shown), and a STI structure 122 for releasing an electric field under a gate electrode 128 and that is formed near a drain side. The STI structure 120 may be formed surrounding an active area of the P-epi layer 104/substrate 102 in which the n-channel LDMOS device may be formed. As one example, the formation of the STI structures 120, 122 may include dry etching a trench in a substrate and filling the trench with insulator materials such as silicon oxide, silicon nitride, or silicon oxynitride. The filled trench may have a multi-layer structure such as a thermal oxide liner layer filled with silicon nitride or silicon oxide. In furtherance of the embodiment, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical polishing (CMP) processing to etch back and planarize, and using a nitride stripping process to remove the silicon nitride. In one embodiment, the depth of STI structures 120, 122 is less than approximately 0.5 um as measured vertically from a surface, depending on the device technology. The STI structure 122 near the drain side may have a full STI structure as will be discussed later below in FIG. 2 or may have a partially slotted STI structure as will be discussed later below in FIG. 3.

The LDMOS device 100 may include a gate structure disposed on the P-epi layer 104/substrate 102, including a gate dielectric 126 and a gate electrode 128 disposed on the gate dielectric 126. The gate structure further includes other features such as spacers 130 as is known in the art. The gate dielectric 126 includes a silicon dioxide layer form by thermal oxidation, chemical vapor deposition (CVD), physical vapor deposition (PVD), atomic layer deposition (ALD), or other suitable processes, or combinations thereof. Alternatively, the gate dielectric 126 may include high dielectric-constant (high-k) materials, silicon oxynitride, other suitable materials, or combinations thereof. The gate dielectric may have a multilayer structure such as one layer of silicon oxide and another layer of high-k material. The gate dielectric layer 126 may have a thickness ranging between about 20 angstroms and about 200 angstroms. In the present embodiment, the gate dielectric layer 126 may have a thickness of about 130 angstroms (for 5V gate voltage operation).

The gate electrode 128 is designed to be coupled to metal interconnects and is disposed overlying the gate dielectric 126. The gate electrode 128 includes doped polycrystalline silicon (or polysilicon). Alternatively, the gate electrode layer may include a metal such as Al, Cu, W, Ti, Ta, TiN, TaN, NiSi, CoSi, other suitable conductive materials, or combinations thereof. The gate electrode 128 may be formed by CVD, PVD, plating, and other proper processes. The gate electrode 128 may have a multilayer structure and may be formed in a multiple-step process.

The LDMOS device 100 may include a p-type base (also referred to as p-body) region 132 is formed in the N-well region 112. The p-type base region 132 may be laterally interposed between the isolation feature 120 and the gate electrode 128. The p-type base region 132 is further extended to a portion of the epi layer 104/substrate 102 such that the p-type base region 132 is partially underlying the gate electrode 128. The p-type base region 132 includes p-type dopant such as boron and is formed by a method including ion implantation. In one embodiment, the p-type base region 132 is formed by an ion-implantation process with a tilt angle such that the p-type base region 132 is extended partially underlying the gate electrode 128. In furtherance of the embodiment, the ion implantation process may utilize a tilt angle about 45 degree. In other embodiments, the tilt angle of the ion implantation is tuned for optimized channel length.

The LDMOS device 100 may further include a source region 140 and a body contact region 142 adjacent to the source region. The source region 140 and body contact region 142 may be formed in the p-type base region 132. The device 100 may further include a drain region 144 formed in the N-well region 112. The drain region 144 may be disposed between the isolation structure 120 and 122. In the present embodiment, the source region 140 and the drain region 144 may be doped with n-type impurities (N+) such as phosphorous or arsenic for an n-channel LDMOS device. It is understood that the source and drain region may have different structures, such as raised, recessed, or strained features. The body contact region 142 may be doped with p-type impurities (P+) such as boron. The body contact region 142 may function as a guard ring in the LDMOS device 100.

As previously noted, other devices and features may be formed on the epi layer 104/substrate 102 to form an integrated circuit. Other devices may include various transistors, various active and passive features configured and coupled to provide proper functionality in various electronic systems such as high power applications. Additionally, it is understood that the semiconductor device may further include various contacts and metal features formed on the substrate. For example, silicide may be formed by silicidation such as self-aligned silicide (salicide) in which a metal material is formed next to Si structure, then the temperature is raised to anneal and cause reaction between underlying silicon and the metal to form silicide, and un-reacted metal is etched away. The salicide material may be self-aligned to be formed on various features such as the source region, drain region and/or gate electrode to reduce contact resistance.

A plurality of patterned dielectric layers and conductive layers are formed on the substrate to form multilayer interconnects configured to couple the various p-type and n-type doped regions, such as the source region 140, body contact region 142, drain region 144, and gate electrode 128. In one embodiment, an interlayer dielectric (ILD) and a multilayer interconnect (MLI) structure are formed in a configuration such that the ILD separates and isolates each from other of the MLI structure. In furtherance of the example, the MIL structure includes contacts, vias and metal lines formed on the substrate. In one example, the MIL structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical connection (via and contact) and horizontal connection (conductive line). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

The ILD material includes silicon oxide. Alternatively or additionally, the ILD includes a material having a low dielectric constant such as a dielectric constant less than about 3.5. In one embodiment, the dielectric layer includes silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The dielectric layer may be formed by a technique including spin-on, CVD, or other suitable processes.

MLI and ILD structure may be formed in an integrated process such as a damascene process. In a damascene process, a metal such as copper is used as conductive material for interconnection. Another metal or metal alloy may be additionally or alternatively used for various conductive features. Accordingly, silicon oxide, fluorinated silica glass, or low dielectric constant (k) materials can be used for ILD. During the damascene process, a trench is formed in a dielectric layer, and copper is filled in the trench. Chemical mechanical polishing (CMP) technique is implemented afterward to etch back and planarize the substrate surface.

Figure 2:
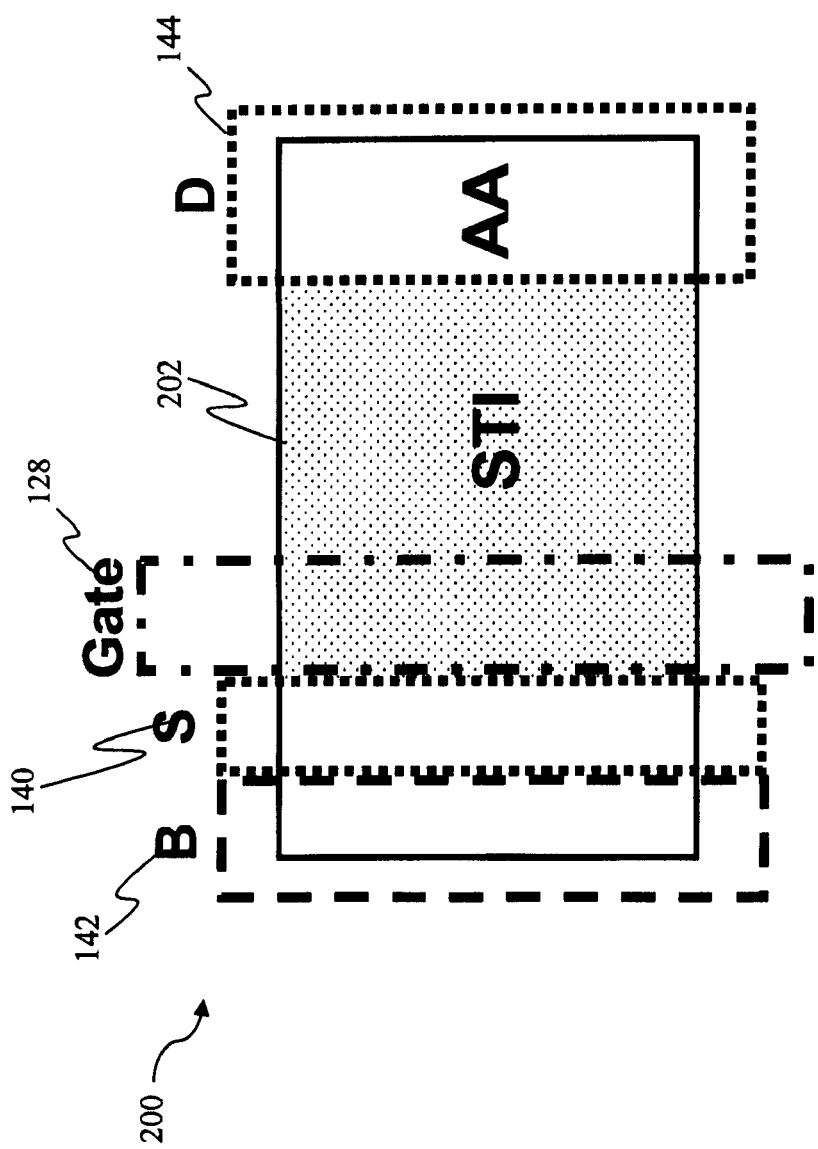
FIG. 2 is a top view of a LDMOS device having a full shallow trench isolation (STI) structure.

Referring to FIG. 2, illustrated is a top view of a LDMOS device 200 with a full STI structure 202. The LDMOS device 200 is similar to the LDMOS device 100 of FIG. 1 except for the configuration of the STI structure 202. Accordingly, similar features in FIGS. 1 and 2 are numbered the same for the sake of clarity and simplicity. The LDMOS device 200 may include a full STI structure 202 that is formed in the epi layer/substrate and disposed between the gate electrode 128 (gate structure) and the drain region 144 (similar to the STI structure 122 of FIG. 1). The full STI structure 202 may be formed within the active area (AA) of the substrate. In the present embodiment, the full STI structure 202 is partially surrounded by the N-well region 112. It has been observed that one of the disadvantages of the full STI structure 202 is that the LDMOS device 200 may exhibit a high on-state resistance as will be discussed below.

Figure 3:
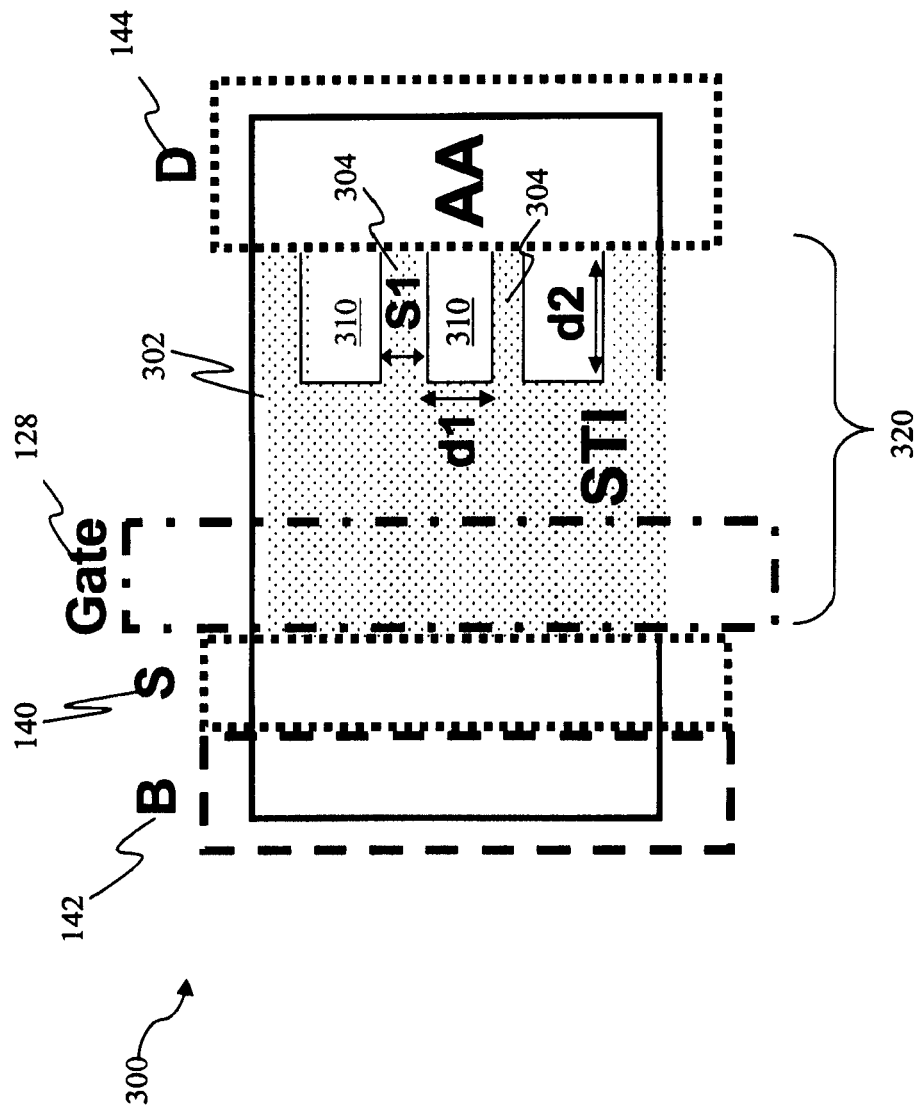
FIG. 3 is a top view of a LDMOS device having a partially slotted STI structure according to various aspects of the present disclosure.

Referring to FIG. 3, illustrated is a top view of a LDMOS device 300 with a partially slotted STI structure 302 according to various aspects of the present disclosure. The LDMOS device 300 is similar to the LDMOS device 100 of FIG. 1 except for the partially slotted STI structure 302. Accordingly, similar features in FIGS. 1 and 3 are numbered the same for the sake of clarity and simplicity. The LDMOS device 300 has a partially slotted STI structure 302 that is formed in the epi layer/substrate and disposed between the gate electrode 128 (gate structure) and the drain region 144 (similar to the STI structure 122 of FIG. 1). In other words, the partially slotted STI structure 302 may include a plurality of projections 304 that have edges adjacent to an edge of the drain region 144. Accordingly, a portion 310 of the active area (AA) of the substrate is disposed between adjacent projections 304 (or within slots between the projections). It is understood that the number of projections may vary depending on the technology node process as well as the particular application. Also, the partially slotted STI structure 302 may easily be formed by modifying a pattern layout of the trenches during the formation of the STI structures in the substrate. The LDMOS device 300 with the partially slotted STI structure 302 has various advantages over the LDMOS device 200 with the full STI structure 202 of FIG. 2 as will be discussed below.

The partially slotted STI structure 302 includes a projection width (S1) that is measured in a direction along the edge of the drain region 144, a projection length (d2) that is measured in a direction from the drain region 144 to the source region 142, and a spacing (d1) between adjacent projections 304. In the present embodiment, it has been observed that the projection width (S1) may range from about 0.8 um to about 1.2 um to provide a 3-dimensional electric field without hurting a breakdown voltage and may improve on-state resistance with a larger active area (AA) when S1 is smaller. Also, it has been observed that the projection length (d2) affects a breakdown voltage dramatically as d2 is increased, and thus the projection length (d2) may range from about 1 um to about 2 um. In some embodiments, the projection length (d2) may be normalized to an overall length 320 of the partially slotted STI structure 302 such that the projection length (d2) is about 25% to 50% of the overall length 320. Further, it has been observed that the spacing (d1) between adjacent projections 304 may range from 1.5 um to about 2 um (with a fixed d2=2 um and S1=1 um) without hurting a breakdown voltage and may reduce an on-state resistance by 20% (as compared to the full STI structure 202 of FIG. 2). It should be noted that the specific examples disclosed above are in reference to a 0.25 um technology node process and that other dimensions may be utilized in other technology processes without departing form the inventive concepts of the present disclosure.

Figure 4B:
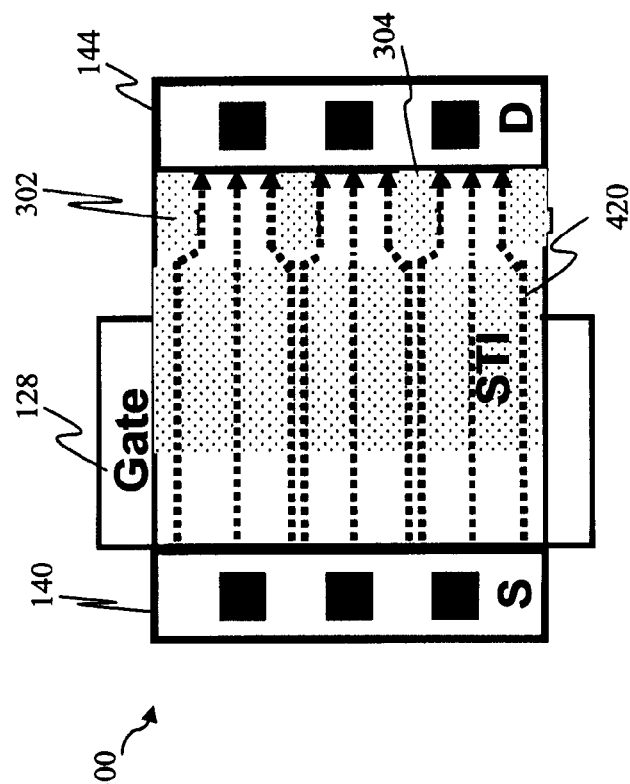
FIGS. 4A and 4B are top views of the LDMOS device of FIG. 2 and the LDMOS device of FIG. 3, respectively, in an on-state condition illustrating a current flow path.
Figure 4A:
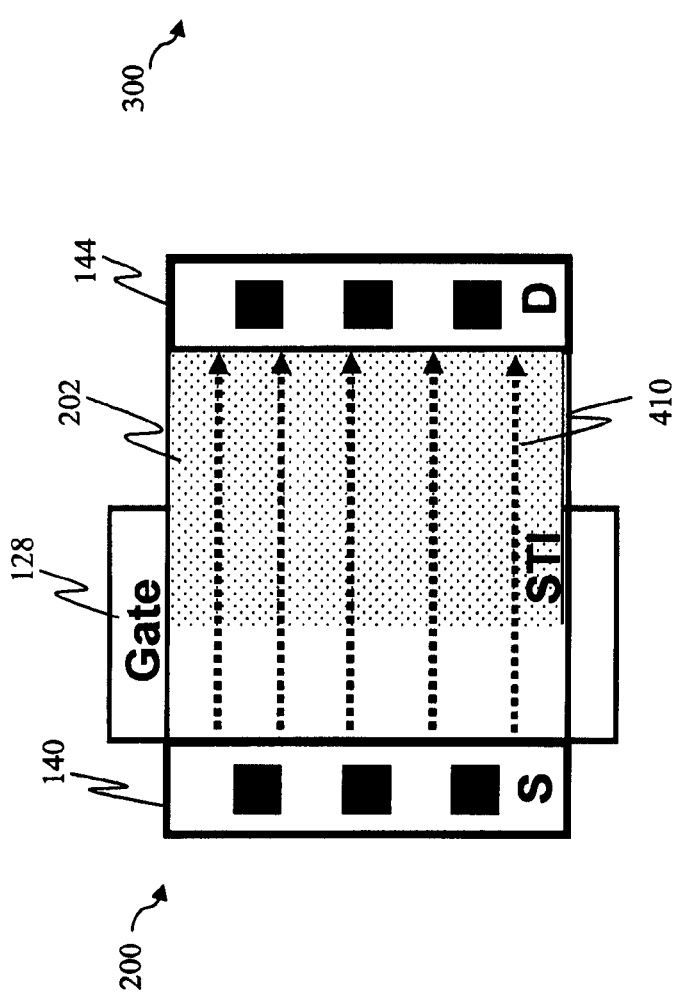

Referring to FIGS. 4A and 4B, illustrated are top views of the LDMOS device 200 of FIG. 2 and the LDMOS device 300 of FIG. 3, respectively, showing current flow lines in an on-state condition. Accordingly, similar features in FIGS. 2, 3, 4A, and 4B are numbered the same for the sake of simplicity and clarity. In FIG. 4A, the current flow lines 410 in an on-state conduction in the LDMOS device 200 with the standard full STI structure 202 are shown traveling from the source (S) region 140 to the drain (D) region 144. The current flow lines 410 travel underneath the gate electrode (gate structure) 128 and the full STI structure 202. However, in FIG. 4B, the current flow lines 420 may travel along a shorter conduction path from the source (S) region 140 to the drain (D) region 144 due to the active area of the substrate between the projections 304 of the partially slotted STI structure 302. Also, the conduction path may be wider near the drain side of the partially slotted STI structure 302. Accordingly, the current flows with the shortest path to provide a smaller on-state resistance and higher driving current in the LDMOS device 300 of FIG. 3 as compared to the LDMOS device 200 of FIG. 2.

The various graphs described below demonstrate a performance of LDMOS devices with various STI configurations (e.g., full STI structure 202 of FIG. 2 and partially slotted STI structures 302 of FIG. 3). In particular, the various graphs demonstrate that LDMOS devices with partially slotted STI structure exhibit a reduced on-state resistance ($R_{on}$) without sacrificing a large decrease in breakdown voltage (BV) as compared to the LDMOS device with the full STI structure. Further, the various graphs below may be used to select the various dimensions (e.g., d1, d2, and S1 discussed in FIG. 3)

of the partially slotted STI configuration for an optimal on-state resistance/breakdown voltage tradeoff performance for a particular application. Moreover, the various graphs discussed below may be better understood with reference to FIGS. 1-4 above.

Figure 5:
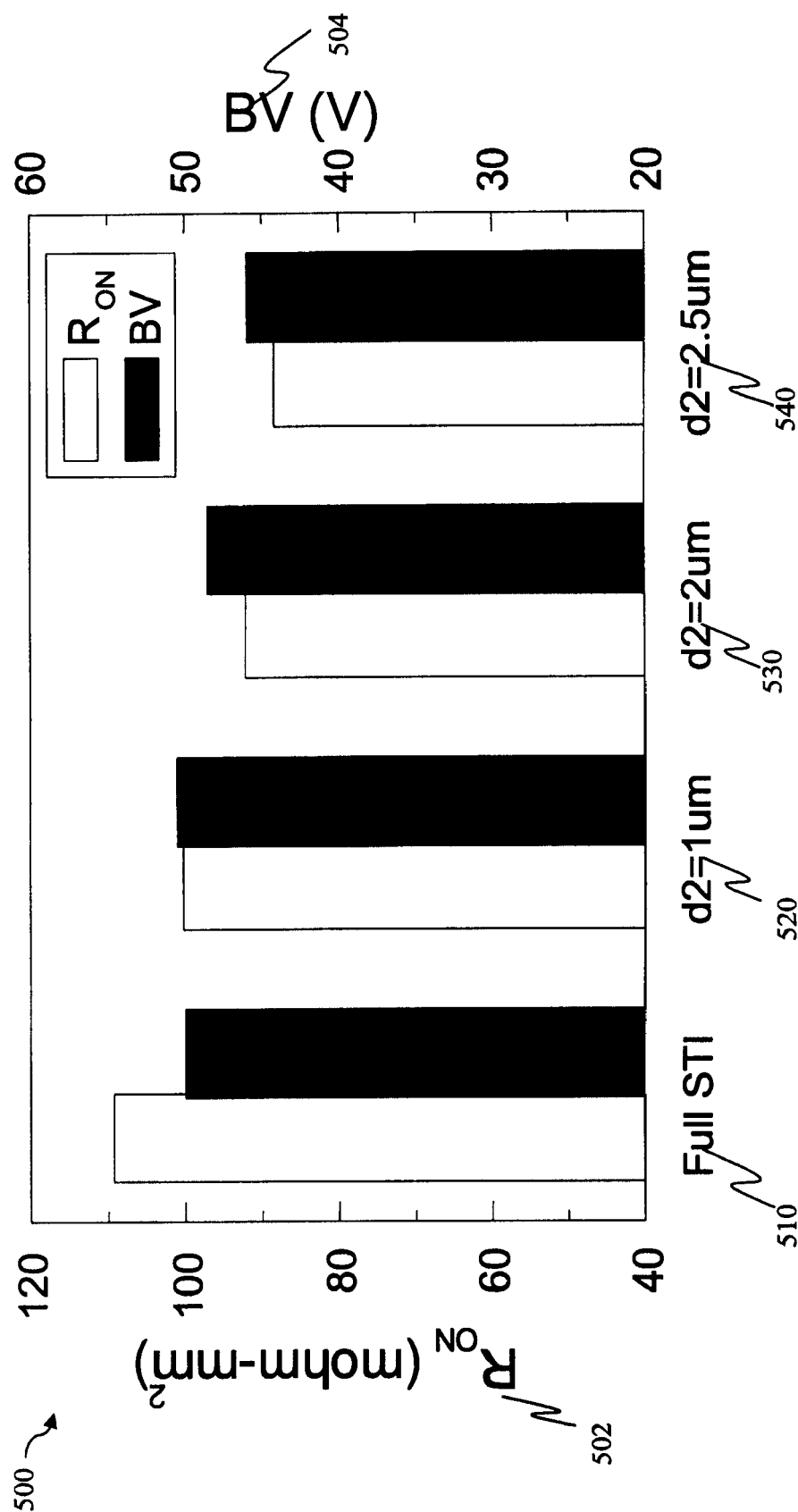
FIG. 5 is a graph illustrating an on-state resistance and a breakdown voltage for LDMOS devices with various STI configurations.

Referring to FIG. 5, illustrated is a graph 500 showing an on-state resistance ($R_{on}$) 502 and a breakdown voltage (BV) 504 for LDMOS devices with various STI configurations. The LDMOS devices may be similar to the LDMOS 100 of FIG. 1. The STI configurations may include a full STI configuration 510 (similar to the full STI configuration 200 of FIG. 2) and various partially slotted STI configurations 520, 530, 540 (similar to the partially slotted STI configuration 300 of FIG. 3). The partially slotted STI configurations 520, 530, 530 include the same dimensions for S1=1 um and d1=0.3 um but different d2 dimensions. The partially slotted STI configuration 520 includes d2=1 um, the partially slotted STI configuration 530 includes d2=2 um, and the partially slotted STI configuration 540 includes d2=2.5 um. From the graph 500, it has been observed that the LDMOS device with the full STI configuration 510 may exhibit an on-state resistance of about 109.2 mohm-mm and a BV of about 50V. Also, for the LDMOS devices with the partially slotted STI configurations 520, 530, 540, the on-state resistances are reduced without sacrificing the breakdown voltage. For example, the LDMOS device with the partially slotted STI configuration 540 (d2=2.5 um) may exhibit an on-state resistance that is reduced by nearly 20%, and the maximum decrease in breakdown voltage is about 6%.

Figure 6:
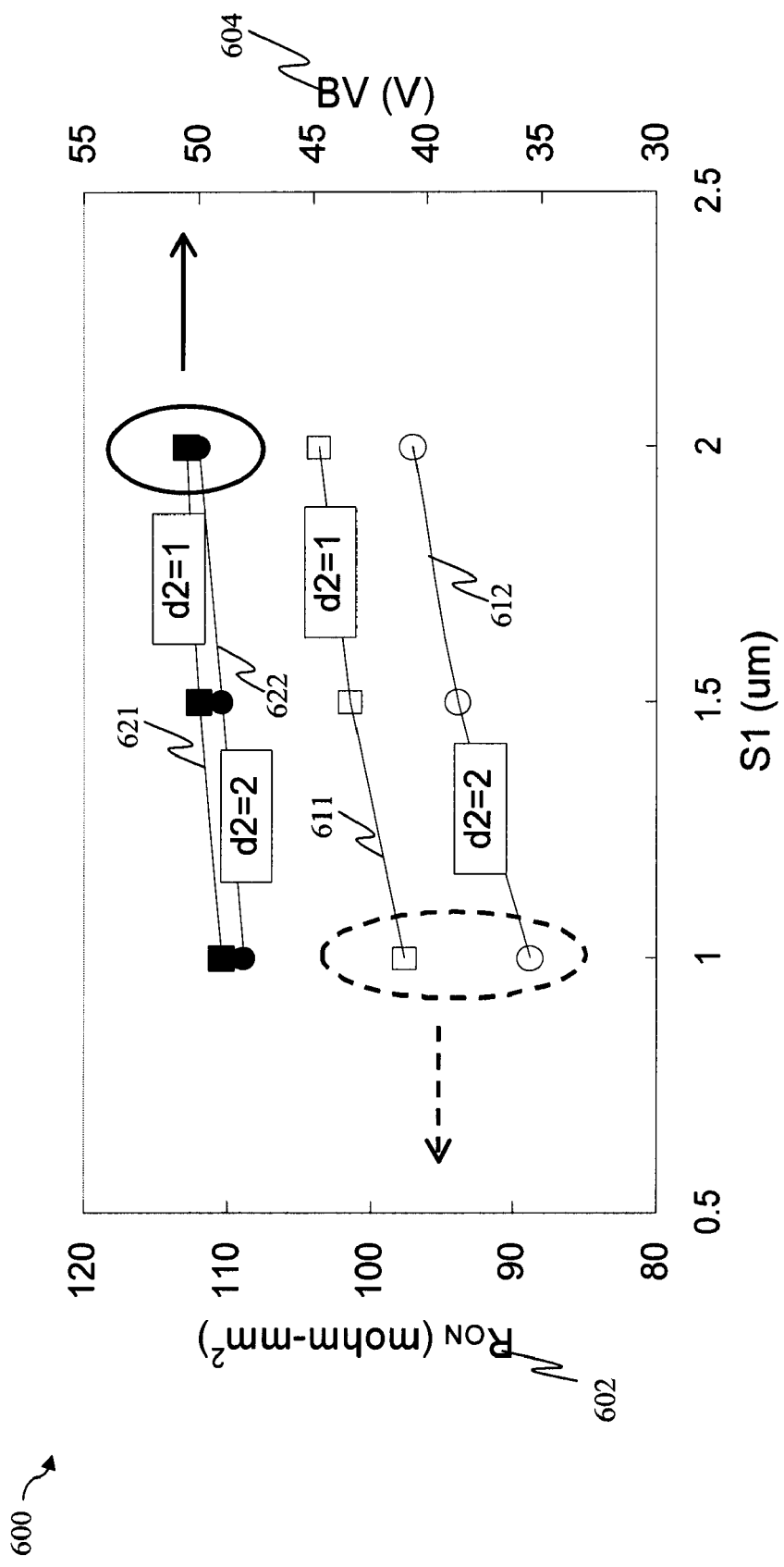
FIG. 6 is a graph illustrating an on-state resistance and a breakdown voltage for LDMOS devices with partially slotted STI configurations of different slot widths.

Referring to FIG. 6, illustrated is a graph 600 showing an on-state resistance ($R_{on}$) 602 and a breakdown voltage (BV) 604 of LDMOS devices with various partially slotted STI configurations. The LDMOS devices may be similar to the LDMOS device 100 of FIG. 1. The various partially slotted STI configurations (similar to the partially slotted configuration 300 of FIG. 3) may include configurations with the same dimension for d1=0.5 um but different dimensions for S1 of 1 um, 1.5 um, and 2 um and different dimensions for d2 of 1 um and 2 um. More specifically, a line 611 shows an on-state resistance 602 for configurations of d1=0.5 um, d2=1 um, and S1=1 um, 1.5 um, and 2 um. A line 612 shows an on-state resistance 602 for configurations of d1=0.5 um, d2=2 um, and S1=1 um, 1.5 um, and 2 um. A line 621 shows a breakdown voltage for configurations of d1=0.5 um, d2=1 um, and S1=1 um, 1.5 um, and 2 um. A line 622 shows a breakdown voltage for configurations of d1=0.5 um, d2=2 um, and S1=1 um, 1.5 um, and 2 um. From the graph 600, it has been observed that more than 10% on-state resistance improvement may be achieved with the configuration of d1=0.5 um, d2=2 um, and S1=2 um. Additionally, with a 2-3V reduction in breakdown voltage (about 5%), the on-state resistance can be reduced to about 20% for the configuration of d1=0.5 um, d2=2 um, and S1=1 um. Accordingly, the various parameters (e.g., d1, d2, and S1) may be optimized for a particular application to achieve the best on-state resistance/breakdown voltage tradeoff performance.

Figure 7:
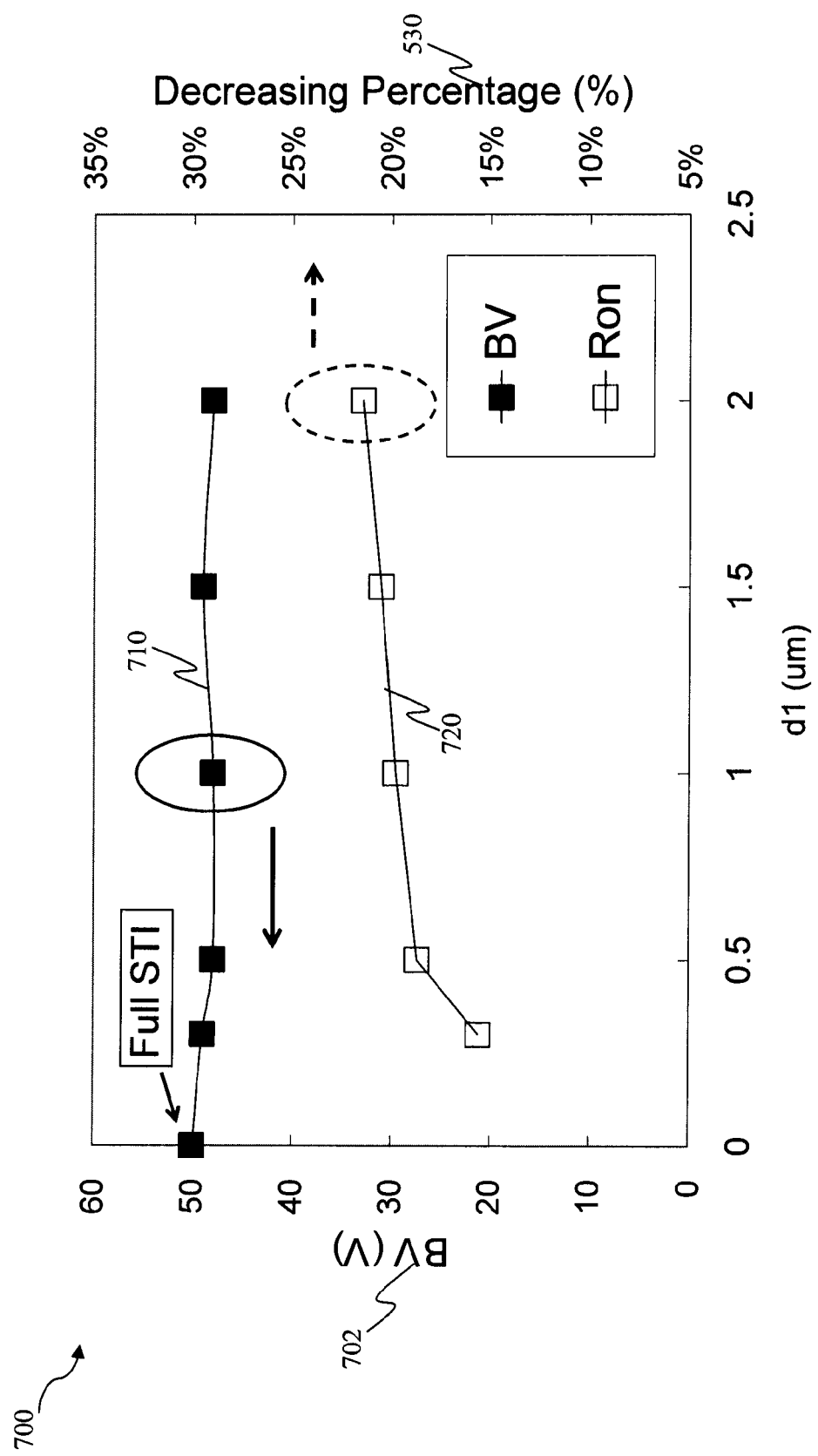
FIG. 7 is a graph illustrating a breakdown voltage and a decreasing percentage of an on-state resistance for LDMOS devices with STI configurations of different active area widths between slots.

Referring to FIG. 7, illustrated is a graph 700 showing a breakdown voltage (BV) 702 and a decreasing percentage of an on-state resistance 704 for LDMOS devices with various STI configurations. The LDMOS devices may be similar to the LDMOS device 100 of FIG. 1. The various STI configurations may include configurations with the same dimension for d2=2 um and S1=1 um but different dimensions for d1 of 0, 0.5 um, 1 um, 1.5 um, and 2 um. It should be noted that the configuration of d1=0 is a full STI configuration (similar to the full STI configuration 200 of FIG. 2) and the configurations of d1=0.5 um, 1 um, 1.5 um, and 2 um are partially slotted STI configurations (similar to the partially slotted configuration 300 of FIG. 3). A line 710 shows the breakdown voltage (V) for the various configurations and a line 720 shows the decreasing percentage of the on-state resistance (%) for the various configurations. From the graph 700, it has been observed that the best improvement for the on-state resistance is about 20.5% with almost no change in the breakdown voltage for an optimum design.

Figure 8:
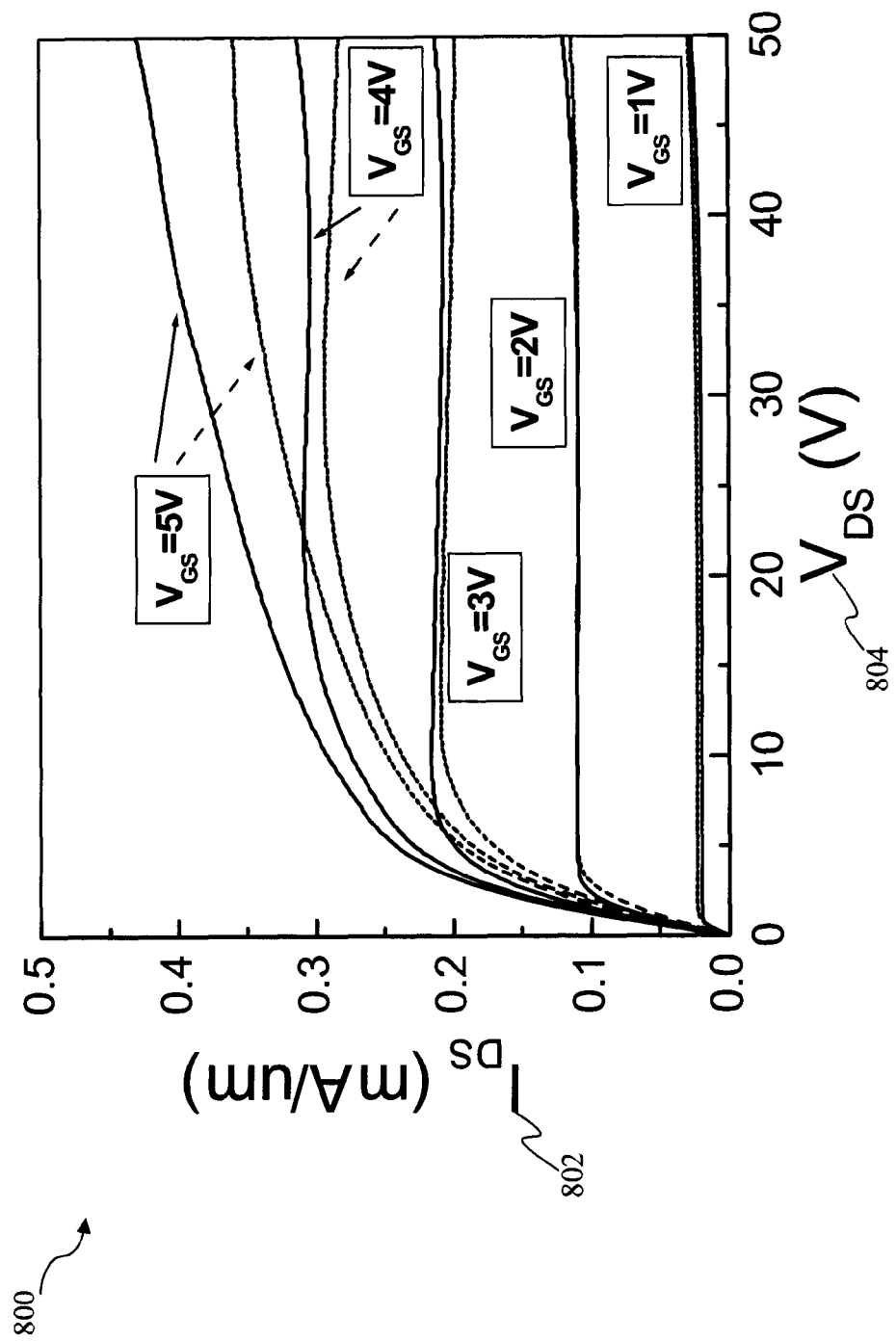
FIG. 8 is a graph illustrating a drain drive current ($I_{DS}$) vs. drain-to-source voltage ($V_{DS}$) characteristics in an on-state condition for LDMOS devices with a full STI configuration and with partially slotted STI configuration, respectively.

Referring to FIG. 8, illustrated is a graph 800 illustrating an relationship between a drain drive current ($I_{DS}$) 802 and a drain-to-source voltage ($V_{DS}$) 804 for a LDMOS device with a full STI configuration (dotted lines) and a LDMOS device with a partially slotted STI configuration (solid lines). The LDMOS device with the full STI configuration is similar to the device 200 of FIG. 2 and the LDMOS device the partially slotted STI configuration is similar to the device 300 of FIG. 3. The graph 800 shows the $I_{DS}$ v. $V_{DS}$ characteristics of the devices in an on-state with a gate-to-source voltage ($V_{GS}$) of 1V, 2V, 3V, 4V, and 5V. From the graph 800, the drain drive currents are quasi-saturated at $V_{GS}$=4V and 5V in the standard LDMOS device with the full STI. Further, the LDMOS device with the partially slotted STI configuration shows a higher drive current as compared to the standard LDMOS device.

Figure 9:
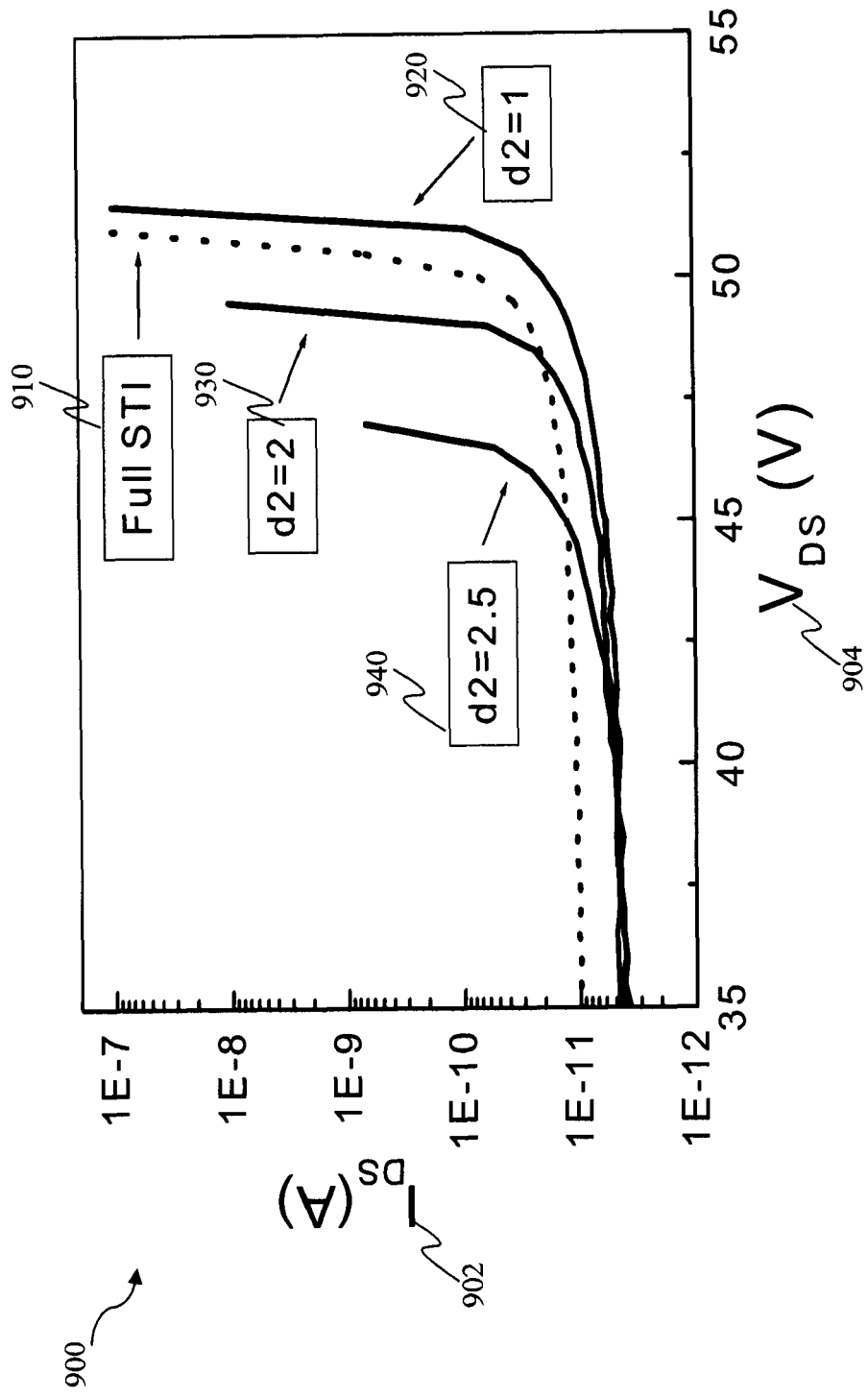
FIG. 9 is a graph illustrating a drain drive current ($I_{DS}$) vs. drain-to-source voltage ($V_{DS}$) characteristics in an off-state condition for LDMOS devices with a full STI configuration and with partially slotted STI configurations of different slot lengths, respectively.

Referring to FIG. 9, illustrated is a graph 900 illustrating a reverse bias off-state relationship between a drain drive current ($I_{DS}$) and a drain-to-source voltage ($V_{DS}$) for LDMOS devices with various STI configurations. The LDMOS devices may be similar to the LDMOS 100 of FIG. 1. The STI configurations may include a full STI configuration 910 (similar to the full STI configuration 200 of FIG. 2) and various partially slotted STI configurations 920, 930, 940 (similar to the partially slotted STI configuration 300 of FIG. 3). The partially slotted STI configurations 920, 930, 930 include the same dimensions for S1=1 um and d1=0.3 um but different d2 dimensions. The partially slotted STI configuration 920 includes d2=1 um, the partially slotted STI configuration 930 includes d2=2 um, and the partially slotted STI configuration 940 includes d2=2.5 um. From the graph 900, it has been observed that the breakdown voltage decreases slightly as d2 is extended. This may be due to a lack of the vertical double RESURF (reference number of FIG. 1) as d2 extends to 2.5 um (line 940) such that the power N-well (reference number of FIG. 1) cannot be fully depleted. However, for d2=1 um (line 920) the breakdown voltage is slightly higher than the standard full STI configuration because of an X-directional dielectric RESURF and 3-dimensional electric field shaping.

In summary, the present invention achieves different advantages in various embodiments. For example, the present disclosed methods and devices provide a high voltage device with a partially slotted STI structure proximate to the drain side. The STI profile near the drain side is partially slotted along the Z-direction (vertical) which provides a shorter current conduction path to raise the drain drive current ($I_{DS}$) in the on-state condition. Additionally, a 3-dimensional electric filed (dielectric RESURF) also keeps the breakdown voltage from decreasing for the less double RESURF in the vertical direction due to the STI opening in the slotted structure. Accordingly, some of the advantages include (1) reduced on-state resistance ($R_{on}$) of about 20%, (2) negligible decrease in a breakdown voltage in an off-state, (3) layout enabled to form the slots in the STI without increasing process complexity, (4) and easily integrated into other technology process. Thus, the reduced on-state resistance and high drive current for medium voltage power devices (e.g., in advanced 0.25 um BiCMOS-DMOS process) are provided without sacrificing or hurting the breakdown voltage.

Among various embodiments, the present method and structure provide reduced on-state resistance while maintaining a high breakdown voltage. The disclosed structure and method may have various embodiments, modifications and variations. In one example, the high voltage semiconductor devices may further include a stress layer overlying the substrate and gate features. The stress layer may comprise silicon nitride, silicon oxynitride, silicon oxide, and silicon carbide. In another embodiment, the source and drain regions may have different structures, such as raised, recessed, or strained. It is understood that the high voltage semiconductor device may not be limited to an n-channel LDMOS device and can be extended to a p-channel LDMOS having a partially slotted STI structure except that all doping types may be reversed and dimensions are modified according to p-channel LDMOS design. Further embodiments may also include, but are not limited to, vertical diffused metal-oxide-semiconductor (VDMOS), other types of high power MOS transistors, Fin structure field effect transistors (FinFET), and strained MOS structures.

Thus, the present disclosure provides a semiconductor device that includes a semiconductor substrate, a source region and a drain region formed in the substrate, a gate structure formed on the substrate disposed between the source and drain regions, and a first isolation structure formed in the substrate between the gate structure and the drain region, the first isolation structure including a plurality of projections that are located proximate to an edge of the drain region. Each of the plurality of projections includes a width measured in a first direction along the edge of the drain region and a length measured in a second direction perpendicular to the first direction, and adjacent projections are spaced a distance from each other. In some embodiments, the first isolation structure includes an overall length measured in the second direction and the projection length ranges from about 25% to about 50% of the overall length of the first isolation structure. In other embodiments, the projection length ranges from about 1 um to about 2 um. In some other embodiments, the projection width ranges from about 0.8 um to about 1.2 um. In some embodiments, the distance between adjacent projections ranges from 1.5 um to about 2 um.

In still other embodiments, the semiconductor device further includes a base region formed in the substrate, the base region having a first type of conductivity and underlying a portion of the gate structure and a well region formed in the substrate, the well region having a second type of conductivity different from the first type of conductivity and underlying another portion of the gate structure. The source region is partially surrounded by the base region, the source region having the second type of conductivity and the drain region is partially surrounded by the well region, the drain region having the second type of conductivity. In other embodiments, the semiconductor device further includes a double RESURF layer formed in the substrate, the double RESURF having the first type of conductivity and underlying the well region and a buried layer formed in the substrate, the buried layer having the second type of conductivity and underlying the base region and the double RESURF layer. In some other embodiments, the semiconductor device further includes a body contact region formed in the substrate and adjacent to the source region, the body contact region having the first type of conductivity. In other embodiments, the semiconductor device further includes a second isolation structure formed in the substrate, the second isolation structure having a first portion adjacent to the drain region and a second portion adjacent to the base region. The second isolation structure isolates the semiconductor device from neighboring devices.

The present disclosure also provides another semiconductor device that includes a semiconductor substrate, a source region and a drain region disposed in the substrate, a gate structure disposed on the substrate between the source and drain regions, and a first shallow trench isolation (STI) structure disposed in the substrate, the first STI structure including at least two projections having edges adjacent to an edge of the drain region. In some embodiments, the projection width ranges from about 0.8 um to about 1.2 um, the projection length ranges from about 1 um to about 2 um, and the distance between adjacent projections ranges from about 1.5 um to about 2 um. In other embodiments, the first STI structure has an overall length measured in the second direction, the overall length including the projection length. The projection length ranges from about 25% to about 50% of the overall length. In some other embodiments, the source region and drain region have a first type of conductivity and the semiconductor device further includes a body contact region disposed in the substrate adjacent to the source region, the body contact region having a second type of conductivity different from the first type of conductivity.

In yet other embodiments, the semiconductor device further includes a first doped region disposed in the substrate such that the source region and the body contact region are partially surrounded by the first doped region, the first doped region having the second type of conductivity and a second doped region disposed in the substrate such that the drain region and first STI structure are partially surrounded by the second doped region, the second doped region having the first type of conductivity. In some embodiments, the semiconductor device further includes a double RESURF layer disposed in the substrate such that the second doped region substantially overlies the double RESURF layer, the double RESURF layer having the second type of conductivity. In other embodiments, the semiconductor device further includes a buried layer disposed in the substrate such that the first doped region and the double RESURF layer substantially overlies the buried layer. In some other embodiments, the semiconductor device further includes a second STI structure disposed in the substrate for isolating the semiconductor device from neighboring devices, the second STI structure having a first portion adjacent to the body contact region and a second portion adjacent to the drain region. The drain region is disposed between the first STI and the second portion of the second STI structure.

Further, the present disclosure provides a semiconductor device that includes a semiconductor substrate having an active area, a first doped region formed in the substrate, the first doped region having a first type of conductivity, a second doped region formed in the substrate adjacent to the first doped region, the second doped region having a second type of conductivity different from the first type of conductivity, a source region formed in the substrate and partially surrounded by the first doped region, the source region having the second type of conductivity, a drain region formed in the substrate and partially surrounded by the second doped region, the drain region having the second type of conductivity, a gate structure formed on the substrate and located between the source region and the drain region, and an isolation structure formed in the substrate disposed between the gate structure and the drain region, the isolation structure having a partially slotted structure. A portion of the active area is located within each slot of the partially slotted structure of the isolation structure. In some embodiments, the isolation structure has an overall length measured in a direction from the drain region to the source region where each slot has a length measured in the same direction as the overall length, the slot length ranging from about 25% to about 50% of the overall length of the isolation structure.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device comprising:
   a semiconductor substrate comprising an active area;
   a source region and a drain region formed in the substrate;
   a gate structure formed on the substrate disposed between the source and drain regions; and
   a first isolation structure formed in the substrate between the gate structure and the drain region, the first isolation structure including a plurality of projections that each project toward the drain region and that are located proximate to an edge of the drain region, wherein the plurality of projections are connected together via a portion of the first isolation structure;
   wherein each of the plurality of projections includes a width measured in a first direction along the edge of the drain region and a length measured in a second direction perpendicular to the first direction and wherein adjacent projections are spaced a distance from each other; and
   wherein a portion of the active area is disposed between each pair of the projections of the first isolation structure and is arranged such that it comprises a portion of a direct conduction path between the source region and the drain region.

2. The semiconductor device of claim 1,
   wherein the first isolation structure includes an overall length measured in the second direction; and
   wherein the projection length ranges from about 25% to about 50% of the overall length of the first isolation structure.

3. The semiconductor device of claim 1, wherein the projection length ranges from about 1 um to about 2 um.

4. The semiconductor device of claim 3, wherein the projection width ranges from about 0.8 um to about 1.2 um.

5. The semiconductor device of claim 4, wherein the distance between adjacent projections ranges from 1.5 um to about 2 um.

6. The semiconductor device of claim 1, further comprising:
   a base region formed in the substrate, the base region having a first type of conductivity and underlying a portion of the gate structure; and
   a well region formed in the substrate, the well region having a second type of conductivity different from the first type of conductivity and underlying another portion of the gate structure;
   wherein the source region is partially surrounded by the base region, the source region having the second type of conductivity;
   wherein the drain region is partially surrounded by the well region, the drain region having the second type of conductivity.

7. The semiconductor device of claim 6, further comprising:
   a double RESURF layer formed in the substrate, the double RESURF having the first type of conductivity and underlying the well region; and
   a buried layer formed in the substrate, the buried layer having the second type of conductivity and underlying the base region and the double RESURF layer.

8. The semiconductor device of claim 1, further comprising a body contact region formed in the substrate and adjacent to the source region, the body contact region having the first type of conductivity.

9. The semiconductor device of claim 8,
   further comprising a second isolation structure formed in the substrate, the second isolation structure having a first portion adjacent to the drain region and a second portion adjacent to the base region;
   wherein the second isolation structure isolates the semiconductor device from neighboring devices.

10. A semiconductor device comprising:
    a semiconductor substrate comprising an active area;
    a source region and a drain region disposed in the substrate;
    a gate structure disposed on the substrate between the source and drain regions; and
    a first shallow trench isolation (STI) structure disposed in the substrate, the first STI structure including a base portion and at least two projections that project toward and have edges adjacent to an edge of the drain region, the at least two projections connected to each other via the base portion;
    wherein a portion of the active area is disposed between the at least two projections of the STI structure and is arranged such that it comprises a portion of a direct conduction path between the source region and the drain region.

11. The semiconductor device of claim 10,
    wherein each projection includes a width measured in a first direction along the edge of the drain region and a length measured in a second direction perpendicular to the first direction; and
    wherein adjacent projections are spaced a distance apart from each other.

12. The semiconductor device of claim 11, wherein the projection width ranges from about 0.8 um to about 1.2 um, wherein the projection length ranges from about 1 um to about 2 um, and wherein the distance between adjacent projections ranges from about 1.5 um to about 2 um.

13. The semiconductor device of claim 11,
    wherein the first STI structure has an overall length measured in the second direction, the overall length including the projection length; and
    wherein the projection length ranges from about 25% to about 50% of the overall length.

14. The semiconductor device of claim 10,
    wherein the source region and drain region have a first type of conductivity; and
    further comprising a body contact region disposed in the substrate adjacent to the source region, the body contact region having a second type of conductivity different from the first type of conductivity.

15. The semiconductor device of claim 14, further comprising:
    a first doped region disposed in the substrate such that the source region and the body contact region are partially surrounded by the first doped region, the first doped region having the second type of conductivity; and a second doped region disposed in the substrate such that the drain region and first STI structure are partially surrounded by the second doped region, the second doped region having the first type of conductivity.

16. The semiconductor device of claim 15, further comprising a double RESURF layer disposed in the substrate such that the second doped region substantially overlies the double RESURF layer, the double RESURF layer having the second type of conductivity.

17. The semiconductor device of claim 16, further comprising a buried layer disposed in the substrate such that the first doped region and the double RESURF layer substantially overlies the buried layer.

18. The semiconductor device of claim 14,
further comprising a second STI structure disposed in the substrate for isolating the semiconductor device from neighboring devices, the second STI structure having a first portion adjacent to the body contact region and a second portion adjacent to the drain region; and
wherein the drain region is disposed between the first STI and the second portion of the second STI structure.

19. A semiconductor device comprising:
a semiconductor substrate having an active area;
a first doped region formed in the substrate, the first doped region having a first type of conductivity;
a second doped region formed in the substrate adjacent to the first doped region, the second doped region having a second type of conductivity different from the first type of conductivity;
a source region formed in the substrate and partially surrounded by the first doped region, the source region having the second type of conductivity;
a drain region formed in the substrate and partially surrounded by the second doped region, the drain region having the second type of conductivity;
a gate structure formed on the substrate and located between the source region and the drain region; and
a continuous isolation structure formed in the substrate disposed between the gate structure and the drain region, the continuous isolation structure having a partially slotted structure, including a plurality of slots that extend partially through the continuous isolation structure in a direction away from the drain region;
wherein a portion of the active area is disposed within each slot of the partially slotted structure and is arranged such that it comprises a portion of a direct conduction path between the source region and the drain region.

20. The semiconductor device of claim 19,
wherein the continuous isolation structure has an overall length measured in a direction from the drain region to the source region;
wherein each slot has a length measured in the same direction as the overall length, the slot length ranging from about 25% to about 50% of the overall length of the continuous isolation structure.

* * * * *